United States Patent
Youn et al.

(10) Patent No.: US 9,893,320 B2
(45) Date of Patent: Feb. 13, 2018

(54) METHOD FOR MANUFACTURING LIGHT EXTRACTION SUBSTRATE FOR ORGANIC LIGHT EMITTING ELEMENT, LIGHT EXTRACTION SUBSTRATE FOR ORGANIC LIGHT EMITTING ELEMENT, AND ORGANIC LIGHT EMITTING ELEMENT INCLUDING SAME

(71) Applicant: Corning Precision Materials Co., Ltd., Chungcheongnam-do (KR)

(72) Inventors: Jang Dae Youn, Chungcheongnam-do (KR); Min Seok Kim, Chungcheongnam-do (KR); Seo Hyun Kim, Chungcheongnam-do (KR); Gun Sang Yoon, Chungcheongnam-do (KR); Hong Yoon, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/540,755

(22) PCT Filed: Dec. 29, 2015

(86) PCT No.: PCT/KR2015/014442
§ 371 (c)(1),
(2) Date: Jun. 29, 2017

(87) PCT Pub. No.: WO2016/108594
PCT Pub. Date: Jul. 7, 2016

(65) Prior Publication Data
US 2017/0358776 A1 Dec. 14, 2017

(30) Foreign Application Priority Data
Dec. 29, 2014 (KR) .................. 10-2014-0191739

(51) Int. Cl.
*H01L 51/56* (2006.01)
*H01L 51/52* (2006.01)
*H01L 51/00* (2006.01)

(52) U.S. Cl.
CPC ...... *H01L 51/5268* (2013.01); *H01L 51/0096* (2013.01); *H01L 51/5203* (2013.01); *H01L 51/5275* (2013.01); *H01L 51/56* (2013.01)

(58) Field of Classification Search
CPC .......................... H01L 51/5268; H01L 51/56
See application file for complete search history.

(56) References Cited

U.S. PATENT DOCUMENTS

2010/0230667 A1* 9/2010 Nakamura .......... H01L 51/5268
257/40
2012/0228591 A1* 9/2012 Sawabe ............... H01L 51/5268
257/40
(Continued)

FOREIGN PATENT DOCUMENTS

KR    101093259 B1    12/2011
KR    101318374 B1    10/2013
(Continued)

OTHER PUBLICATIONS

International Search Report for Application No. PCT/KR2015/014442 dated Jul. 11, 2016.

*Primary Examiner* — Zandra Smith
*Assistant Examiner* — Molly Reida
(74) *Attorney, Agent, or Firm* — Lerner, David, Littenberg, Krumholz & Mentlik, LLP

(57) ABSTRACT

The present invention relates to a method for manufacturing a light extraction substrate for an organic light emitting element, a light extraction substrate for an organic light emitting element, and an organic light emitting element that includes the same and, more specifically, to a method for (Continued)

manufacturing a light extraction substrate for an organic light emitting element, a light extraction substrate for an organic light emitting element, and an organic light emitting element that includes the same, which can enhance the light extraction efficiency of an organic light emitting element and, in particular, can reduce the process cost. To this end, the present invention provides the method for manufacturing a light extraction substrate for an organic light emitting element, the light extraction substrate for an organic light emitting element, and the organic light emitting element that includes the same, the method comprising: a mixture preparation step for preparing a mixture by mixing a plurality of thermoplastic polymers in a metal oxide nano-dispersion solution; a mixture coating step for coating the mixture on a base substrate; and a mixture firing step for firing the coated mixture, wherein during the mixture firing step, the plurality of thermoplastic polymers are gasified, and when the mixture firing step is completed, the metal oxide nano-dispersion solution is made as a matrix layer, and closed pores are formed in the positions within the matrix layer that were occupied by the thermoplastic polymers before the gasification.

17 Claims, 13 Drawing Sheets

(56) References Cited

U.S. PATENT DOCUMENTS

| 2013/0341605 A1 | 12/2013 | Yoo et al. |
| 2015/0008424 A1 | 1/2015 | Park et al. |
| 2015/0144900 A1* | 5/2015 | Lee ............ H01L 51/5268 257/40 |
| 2016/0329525 A1* | 11/2016 | Lee ............ H01L 51/5268 |
| 2017/0279083 A1* | 9/2017 | Yoon ............ G02B 5/0242 |
| 2017/0346042 A1* | 11/2017 | Lee ............ H01L 51/5268 |

FOREIGN PATENT DOCUMENTS

| KR | 20130111484 | 10/2013 |
| KR | 20140000426 A | 1/2014 |
| KR | 20140046728 A | 4/2014 |
| KR | 20140074446 A | 6/2014 |

* cited by examiner

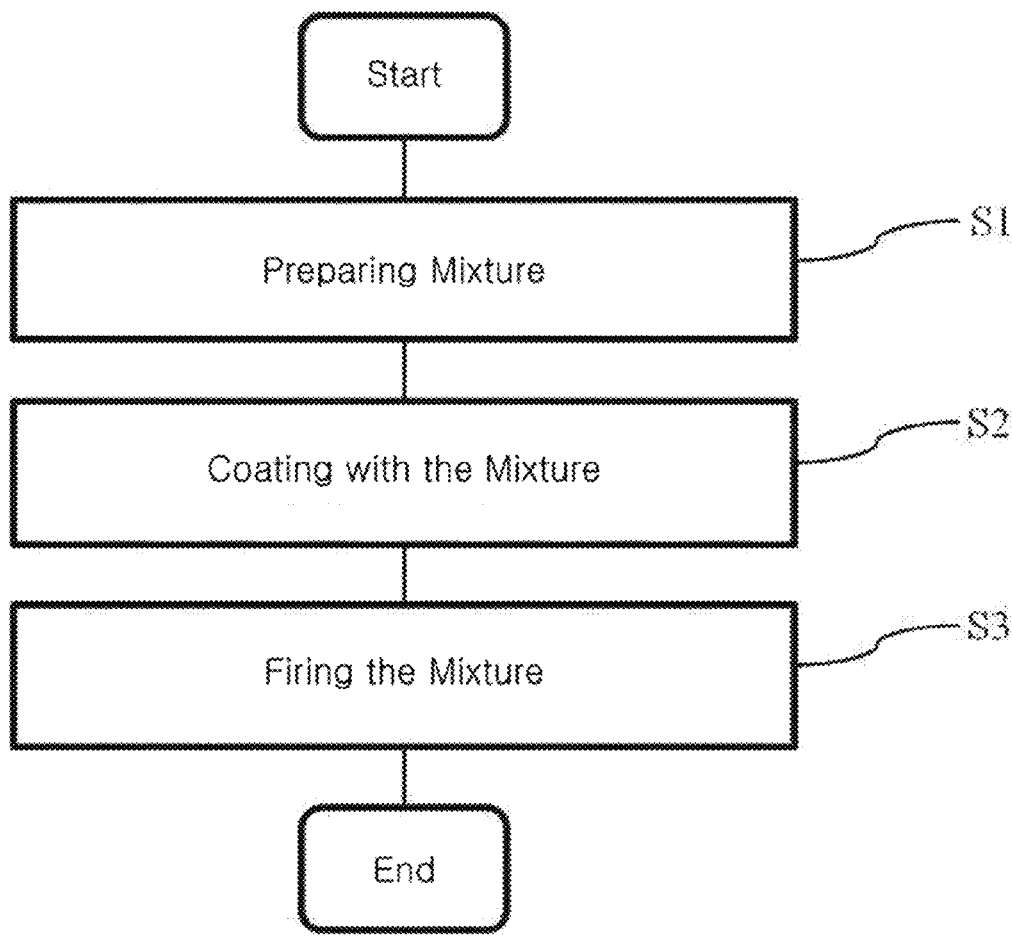
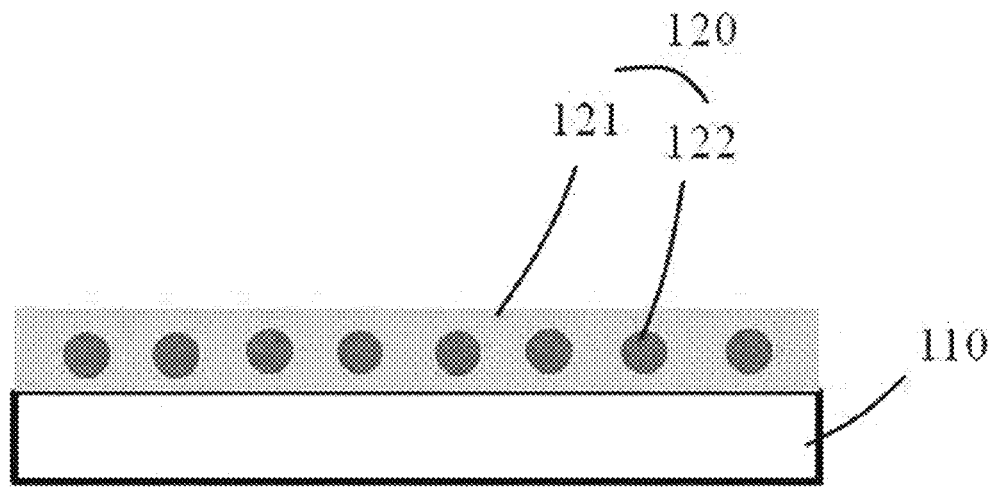

FIG. 15
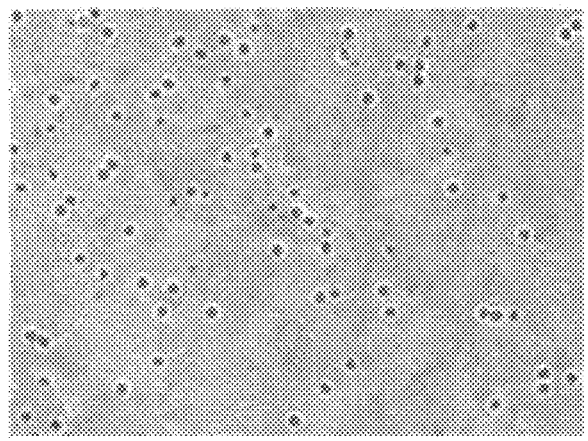
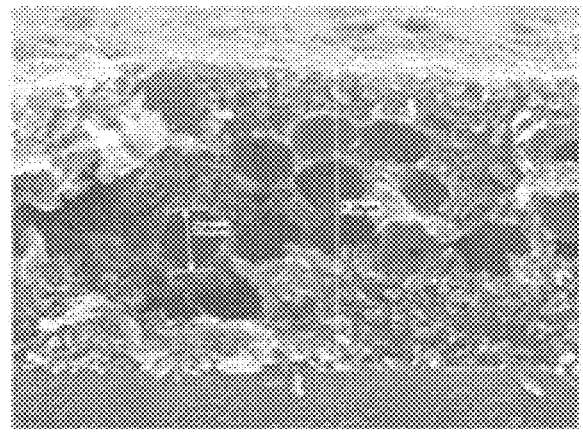

FIG. 16
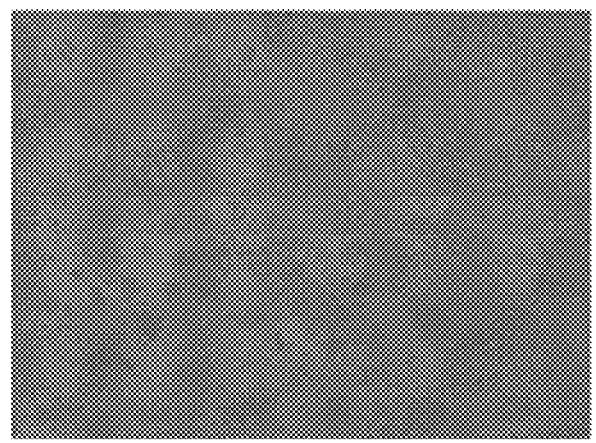
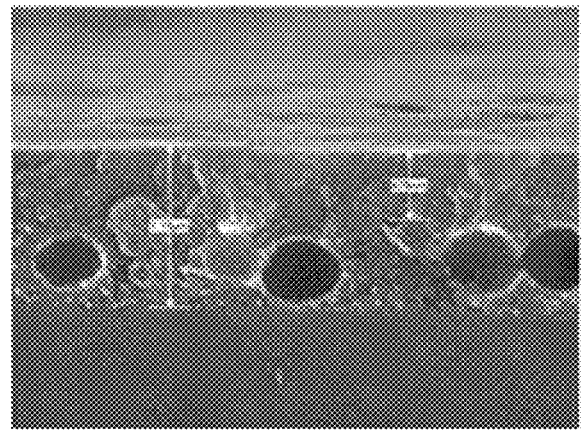

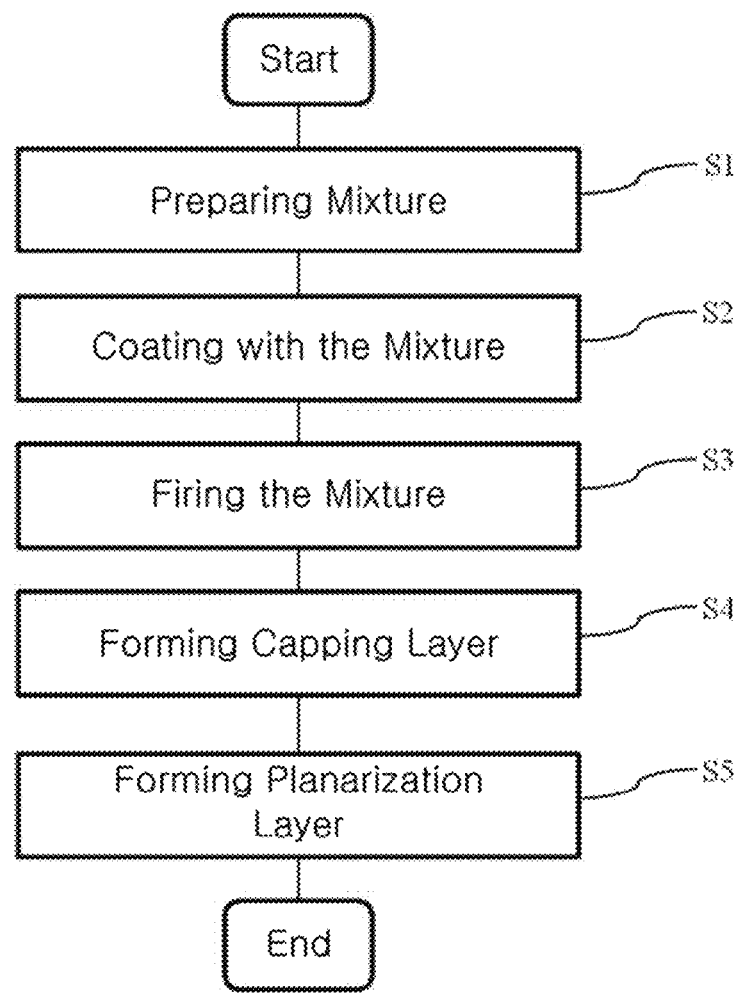
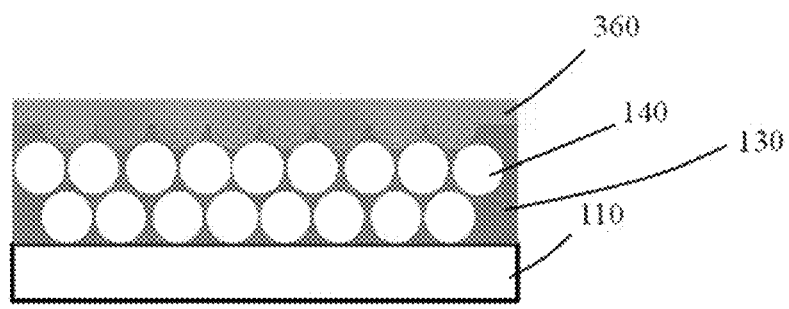

FIG. 19
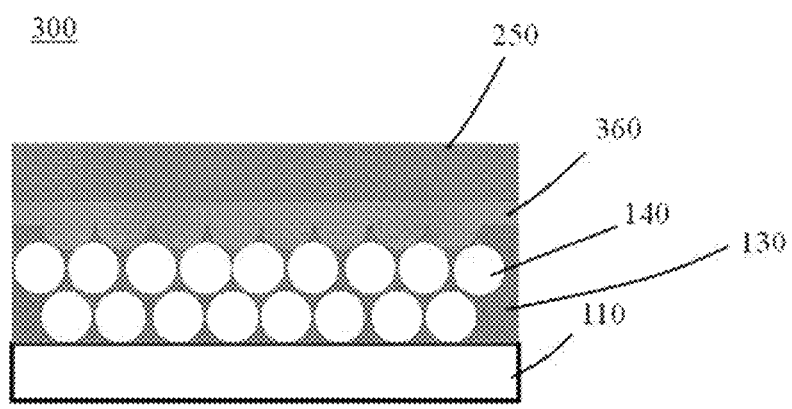
FIG. 20
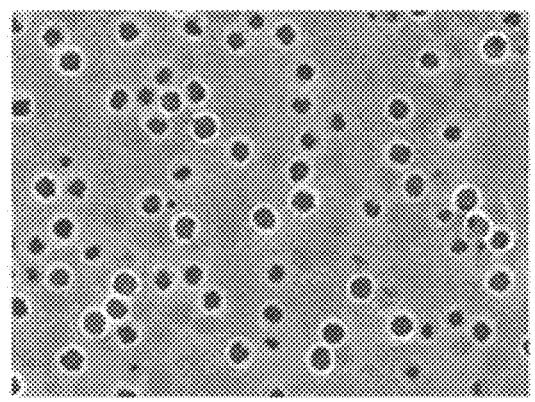
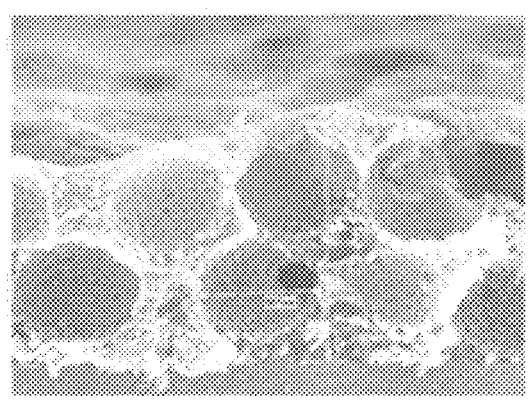

FIG. 21
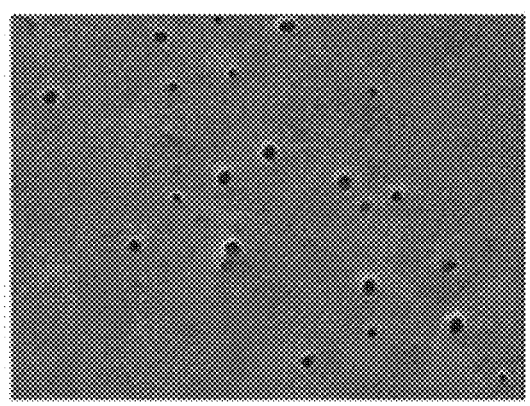
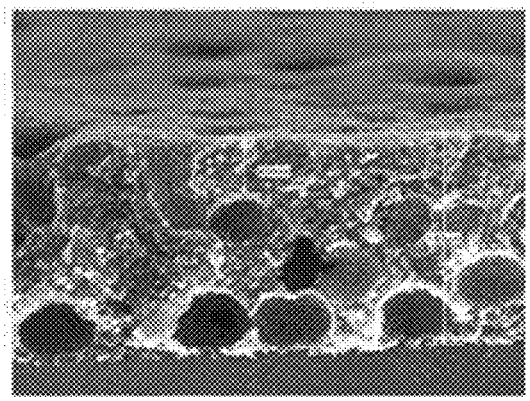

METHOD FOR MANUFACTURING LIGHT EXTRACTION SUBSTRATE FOR ORGANIC LIGHT EMITTING ELEMENT, LIGHT EXTRACTION SUBSTRATE FOR ORGANIC LIGHT EMITTING ELEMENT, AND ORGANIC LIGHT EMITTING ELEMENT INCLUDING SAME

CROSS-REFERENCE TO RELATED APPLICATION

This application is a national phase entry under 35 U.S.C. § 371 of International Application No. PCT/KR2015/014442, filed on Dec. 29, 2015, published in Korean, which claims priority to Korean Patent Application No. 10-2014-0191739, filed on Dec. 29, 2014, the disclosures of which are incorporated herein by reference.

TECHNICAL FIELD

The present disclosure relates to a method of manufacturing a light extraction substrate for an organic light-emitting diode (OLED), a light extraction substrate for an OLED, and an OLED device including the light extraction substrate. More particularly, the present disclosure relates to a method of manufacturing a light extraction substrate for an OLED, in which the light extraction efficiency of an OLED is improved while processing costs are reduced, a light extraction substrate for an OLED, and an OLED device including the same.

BACKGROUND ART

In general, light-emitting devices may be divided into organic light-emitting diode (OLED) devices having a light-emitting layer formed from an organic material and inorganic light-emitting devices having a light-emitting layer formed from an inorganic material. In OLED devices, OLEDs are self-emitting light sources based on the radiative decay of excitons generated in an organic light-emitting layer by the recombination of electrons injected through an electron injection electrode (cathode) and holes injected through a hole injection electrode (anode). OLEDs have a range of merits, such as low-voltage driving, self-emission of light, wide viewing angles, high resolution, natural color reproducibility, and rapid response rates.

Recently, research has been actively undertaken into applying OLEDs to portable information devices, cameras, clocks, watches, office equipment, information display devices for vehicles or similar, televisions (TVs), display devices, lighting systems, and the like.

To improve the luminous efficiency of such above-described OLED devices, it is necessary to improve the luminous efficiency of a material of which a light-emitting layer is formed or light extraction efficiency, i.e. the efficiency with which light generated by the light-emitting layer is extracted.

The light extraction efficiency of an OLED device depends on the refractive indices of OLED layers. In a typical OLED device, when a beam of light generated by the light-emitting layer is emitted at an angle greater than a critical angle, the beam of light may be totally reflected at the interface between a higher-refractivity layer, such as a transparent electrode layer functioning as an anode, and a lower-refractivity layer, such as a glass substrate. This may consequently lower light extraction efficiency, thereby lowering the overall luminous efficiency of the OLED device, which is problematic.

Described in greater detail, only about 20% of light generated by an OLED is emitted from the OLED device and about 80% of the light generated is lost due to a waveguide effect originating from different refractive indices of a glass substrate, an anode, and an organic light-emitting layer comprised of a hole injection layer, a hole transport layer, an emissive layer, an electron transport layer, and an electron injection layer, as well as by total internal reflection originating from the difference in refractive indices between the glass substrate and ambient air. Here, the refractive index of the internal organic light-emitting layer ranges from 1.7 to 1.8, whereas the refractive index of indium tin oxide (ITO), generally used in anodes, is about 1.9. Since the two layers have a significantly low thickness, ranging from 200 nm to 400 nm, and the refractive index of the glass used for the glass substrate is about 1.5, a planar waveguide is thereby formed inside the OLED device. It is calculated that the ratio of the light lost in the internal waveguide mode due to the above-described reason is about 45%. In addition, since the refractive index of the glass substrate is about 1.5 and the refractive index of ambient air is 1.0, when light exits the interior of the glass substrate, a beam of the light, having an angle of incidence greater than a critical angle, may be totally reflected and trapped inside the glass substrate. The ratio of trapped light is about 35%. Therefore, only about 20% of generated light may be emitted from the OLED device.

To overcome such problems, light extraction layers, through which 80% of light that would otherwise be lost in the internal waveguide mode can be extracted, have been actively researched. Light extraction layers are generally categorized as internal light extraction layers and external light extraction layers. In the case of external light extraction layers, it is possible to improve light extraction efficiency by disposing a film including microlenses on the outer surface of the substrate, the shape of the microlenses being selected from among a variety of shapes. The improvement of light extraction efficiency does not significantly depend on the shape of microlenses. On the other hand, internal light extraction layers directly extract light that would otherwise be lost in the light waveguide mode. Thus, the capability of internal light extraction layers to improve light extraction efficiency may be higher than that of external light extraction layers.

To manufacture such an internal light extraction layer, in the related art, a method of forming a different-refractive-index structure within the internal light extraction layer or a coating method using a different-refractive-index material, such as metal oxide particles, has generally been used. The coating method using a different-refractive-index material uses core-shell nanoparticles respectively comprised of a core and a shell, the refractive index of which is different from that of the core, or nanoparticles respectively having a hollow core to manufacture an internal light extraction layer having an increased refractive index difference.

However, nanoparticles having a core-shell structure or respectively having a hollow core are relatively expensive and the price thereof is, for example, five or ten times the price of typical nanoparticles. Thus, the use of such nanoparticles in the manufacturing of an internal light extraction layer increases processing costs, which is problematic.

RELATED ART DOCUMENT

Korean Patent No. 1093259 (Dec. 6, 2011)

DISCLOSURE

Technical Problem

Accordingly, the present disclosure has been made in consideration of the above-described problems occurring in the related art, and the present disclosure proposes a method of manufacturing a light extraction substrate for an organic light-emitting diode (OLED), in which the method can improve the light extraction efficiency of an OLED and especially reduce processing costs, a light extraction substrate for an OLED, and an OLED device including the same light extraction substrate.

Technical Solution

According to an aspect of the present disclosure, provided is a method of manufacturing a light extraction substrate for an OLED. The method may include: preparing a mixture by mixing a number of thermoplastic polymer particles with a nanosuspension of a metal oxide; coating a base substrate with the mixture; and firing the mixture coating the base substrate. The number of thermoplastic polymer particles are vaporized during the firing of the mixture. When the firing of the mixture is completed, a matrix layer is made from the nanosuspension of the metal oxide, and a number of closed voids are formed within the matrix layer, in positions previously occupied by the number of thermoplastic polymer particles before being vaporized.

A refractive index of the metal oxide used in preparing the mixture may range from 1.5 to 2.7.

The metal oxide used in preparing the mixture may be one metal oxide or a combination of two or more metal oxides selected from a candidate group consisting of $SiO_2$, $TiO_2$, $ZrO_x$, $ZnO$, and $SnO_2$.

The metal oxide used in preparing the mixture may be rutile or anatase $TiO_2$.

The number of thermoplastic polymer particles used in preparing the mixture may be one selected from a candidate group consisting of polyethylene terephthalate, polystyrene, polypropylene, poly(acrylic acid), poly(methyl methacrylate), polyethylene naphthalate, and polycarbonates.

The base substrate may be coated with the mixture by bar coating.

The base substrate may be coated with the mixture in a layer-by-layer manner by bar coating.

In the layer-by-layer manner, the mixture may be applied and then dried for respective layers.

The method may further include, after firing the mixture, forming a planarization layer on the matrix layer.

The planarization layer may be formed from an inorganic material or an organic-inorganic hybrid material.

The method may further include, before forming the planarization layer, forming a capping layer on the matrix layer.

The capping layer may be formed from a material the same as the metal oxide, from which the matrix layer is formed.

Firing the mixture may include first firing at a temperature equal to or lower than a melting point of the number of thermoplastic polymer particles and second firing at a temperature equal to or higher than a boiling point of the number of thermoplastic polymer particles.

The first firing and the second firing may be performed in a single heat treatment process.

Firing the mixture may form the matrix layer having a porous structure able to provide vaporization paths to the number of thermoplastic polymer particles, such that the number of closed voids have a closed structure when the number of thermoplastic polymer particles are vaporized.

The base substrate may be a flexible substrate.

The base substrate may be a thin glass sheet having a thickness of 1.5 mm or less.

According to another aspect of the present disclosure, a light extraction substrate for an OLED may include: a base substrate; a matrix layer disposed on the base substrate and formed from a porous metal oxide; and a number of closed voids disposed within the matrix layer, defined by positions from which a number of thermoplastic polymer particles are vaporized. The number of closed voids may have spherical or disc shapes, depending on particle sizes of the metal oxide.

A thickness of the matrix layer may range from 200 nm to 2000 nm.

Diameters of the number of closed voids may range from 30 nm to 1 μm.

The number of closed voids may be arranged in layers within the matrix layer.

The light extraction substrate may further include a planarization layer disposed on the matrix layer, with a surface thereof abutting an OLED.

The light extraction substrate may further include a capping layer disposed between the matrix layer and the planarization layer.

The capping layer may be formed from a material the same as the metal oxide, from which the matrix layer is formed.

The number of closed voids may have spherical or disc shapes, depending on particle sizes of the metal oxide.

The shapes of the number of closed voids may be determined by shapes and sizes of the number of thermoplastic polymer particles.

According to another aspect of the present disclosure, an OLED device including the above-described light extraction substrate disposed on a path on which light exits.

Advantageous Effects

According to the present disclosure, a number of light-scattering closed voids are formed within a matrix layer by vaporizing a number of thermoplastic polymer particles, such that the number of light-scattering closed voids occupy positions previously occupied by the number of thermoplastic polymer particles. This can consequently complexify or diversity paths of light emitted by an OLED, thereby improving the light extraction efficiency of the OLED.

In addition, according to the present disclosure, the shapes and sizes of the number of closed voids occupying the positions of the number of thermoplastic polymer particles are controllable by adjusting the shapes and sizes of the number of thermoplastic polymer particles mixed with a metal oxide nanosuspension.

Furthermore, according to the present disclosure, the density of the number of closed voids formed within the matrix layer is controllable by adjusting the mixing ratio of the metal oxide nanosuspension and the number of thermoplastic polymer particles.

In addition, according to the present disclosure, a base substrate can be coated with a mixture in a layer-by-layer (LbL) manner by bar coating, thereby producing the matrix layer within which the number of closed voids are arranged in layers.

Furthermore, according to the present disclosure, the thickness of a planarization layer to be formed can be reduced by forming a capping layer, formed from the same material as the matrix layer, between the matrix layer and the planarization layer. This can consequently reduce the distance between the organic light-emitting layer of the OLED and the matrix layer acting as an internal light extraction layer of the OLED, thereby further improving the light extraction efficiency of the OLED.

In addition, according to the present disclosure, the number of closed voids formed by vaporizing the number of thermoplastic polymer particles can substitute for relatively expensive light-scattering particles, thereby significantly reducing process unit prices.

DESCRIPTION OF DRAWINGS

FIG. 1 is a process flowchart illustrating a method of manufacturing a light extraction substrate for an OLED according to an exemplary embodiment;

FIGS. 2 to 4 sequentially illustrate process steps of the method of manufacturing a light extraction substrate for an OLED according to the exemplary embodiment;

FIGS. 15 and 16 are electron microscope images taken of a surface and edge of a light extraction substrate manufactured according to another exemplary embodiment, in which FIG. 15 illustrates the images before the formation of a planarization layer and FIG. 16 illustrates the images after the formation of the planarization layer;

FIG. 17 a process flowchart illustrating a method of manufacturing a light extraction substrate for an OLED according to a further another exemplary embodiment;

FIGS. 18 and 19 sequentially illustrate process steps of the method of manufacturing a light extraction substrate for an OLED according to a further another exemplary embodiment;

FIGS. 20 to 22 are electron microscope images taken of a surface and edge of a light extraction substrate manufactured according to a further another exemplary embodiment, in which FIG. 20 illustrates the images before the formation of a capping layer, FIG. 21 illustrates the images before the formation of a planarization layer, and FIG. 22 illustrates the images after the formation of the planarization layer;

MODE FOR INVENTION

Figure 3:
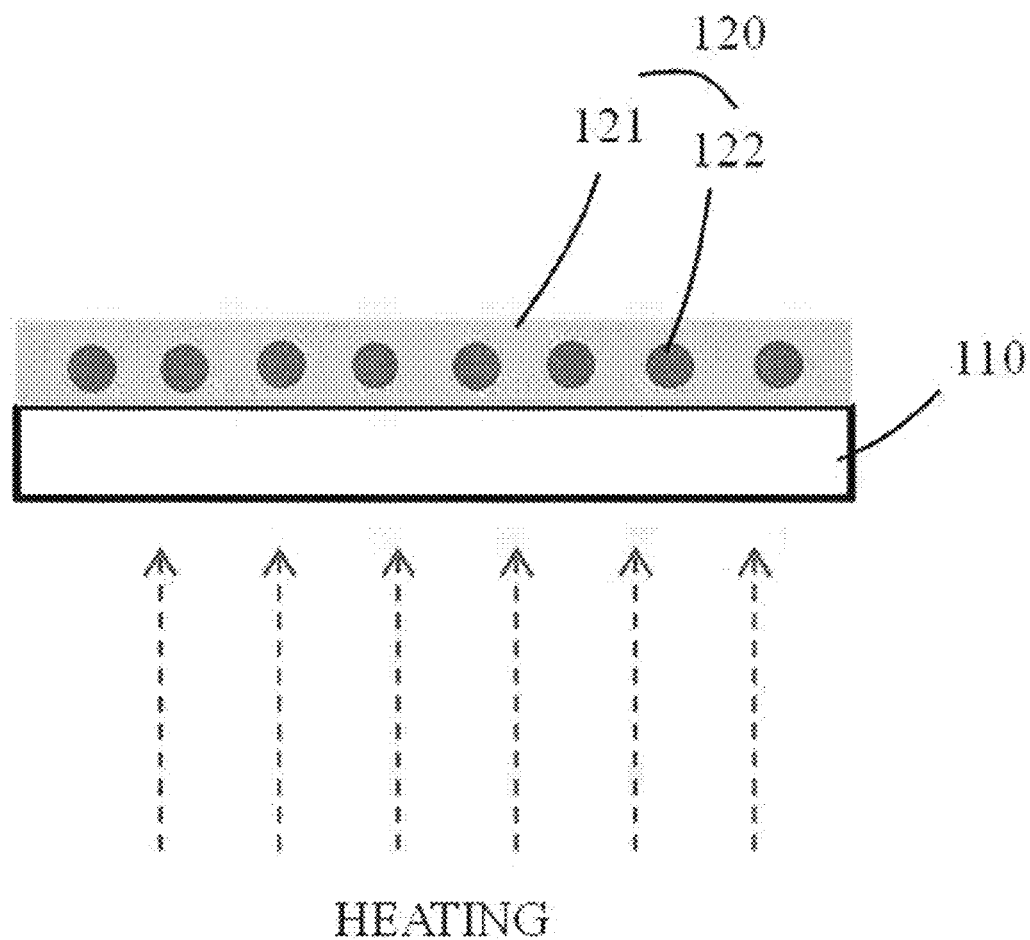

Hereinafter, a method of manufacturing a light extraction substrate for an OLED, a light extraction substrate for an OLED, and an OLED device including the light extraction substrate according to exemplary embodiments will be described in detail with reference to the accompanying drawings.

In the following disclosure, detailed descriptions of known functions and components incorporated in the present disclosure will be omitted in the case that the subject matter of the present disclosure may be rendered unclear by the inclusion thereof.

As illustrated in FIG. 1, a method of manufacturing a light extraction substrate for an OLED according to an exemplary embodiment is a method of manufacturing a light extraction substrate (100 in FIG. 5) disposed on a path, on which light emitted by an OLED (10 in FIG. 5) exits, to function as a route on which light emitted by the OLED (10 in FIG. 5) exits, improve the light extraction efficiency of the OLED (10 in FIG. 5), and protect the OLED (10 in FIG. 5) from the external environment.

As illustrated in FIG. 1, the method of manufacturing a light extraction substrate for an OLED according to the exemplary embodiment includes a mixture preparation step S1, a mixture coating step S2, and a mixture firing step S3.

First, the mixture preparation step S1 is a step of preparing a mixture (120 in FIG. 2) for formation of an internal light extraction layer of the OLED 10. In the mixture preparation step S1 according to the exemplary embodiment, the mixture 120 is prepared by mixing a number of thermoplastic polymer particles (122 in FIG. 2) with a metal oxide nanosuspension (121 in FIG. 2). In the mixture preparation step S1, the metal oxide of the nanosuspension 121 for formation of a matrix layer (130 in FIG. 4) may be a high-refractive-index (HRI) metal oxide, for example, a metal oxide having a refractive index of 1.5 to 2.7. That is, in the mixture preparation step S1, one metal oxide or a combination of two or more metal oxides selected from a candidate group consisting of SiO2, TiO2, ZrOx, ZnO, and SnO2 may be used as the metal oxide for the nanosuspension 121. In particular, in the mixture preparation step S1, the metal oxide for the nanosuspension 121 may be rutile or anatase TiO2. When the TiO2 nanosuspension 121 forms the porous TiO2 matrix layer 130 in the subsequent mixture firing step S3, the shapes of the number of closed voids 140 acting as light scatterers can be controlled, depending on the TiO2 sizes. This feature will be described in greater detail later.

In addition, the number of thermoplastic polymer particles 122, used for formation of the number of closed voids 140 in the mixture preparation step S1, may be formed from one selected from a candidate group consisting of polyethylene terephthalate (PET), polystyrene (PS), polypropylene (PP), poly(acrylic acid) (PAA), poly(methyl methacrylate) (PMMA), polyethylene naphthalate (PEN), and polycarbonates (PC). The number of thermoplastic polymer particles 122 are vaporized in the subsequent mixture firing step S3, which will be described in greater detail later.

Subsequently, as illustrated in FIG. 2, the mixture coating step S2 is a step of coating the top surface of a base substrate 110 with the mixture 120 prepared in the mixture preparation step S1. In the mixture coating step S2, the base substrate 110 may be coated with the mixture 120 at a sufficient thickness to facilitate formation of the number of closed voids (140 in FIG. 4) in the subsequent mixture firing step S3. For example, in the mixture coating step S2, the base substrate 110 may be coated with the mixture 120 at a thickness exceeding the thickness of the matrix layer 130 to be formed, so that the matrix layer 130 can be formed at a thickness of 200 nm to 2000 nm after contraction, subsequent to the firing.

When the light extraction substrate (100 in FIG. 5) manufactured according to the exemplary embodiment is used in an OLED device including the OLED (10 in FIG. 5), the base substrate 110 coated with the mixture 120 is disposed in a front portion of the OLED device, i.e. a portion in which light generated by the OLED (10 in FIG. 5) contacts the ambient air, to allow the light to exit while functioning as an encapsulation substrate to protect the OLED (10 in FIG. 5) from the external environment. The base substrate 110 may be a transparent substrate formed from any transparent material having superior light transmittance and excellent mechanical properties. For example, the base substrate 110 may be formed from a polymeric material, such as a thermally or ultraviolet (UV) curable organic film. Alternatively, the base substrate 110 may be formed from chemically strengthened glass, such as soda-lime glass (SiO2-CaO—Na2O) or aluminosilicate glass (SiO2-Al2O3-Na2O). When the OLED device including the light extraction substrate 100 according to the exemplary embodiment is used for lighting, the base substrate 110 may be formed from soda-lime glass. The base substrate 110 may also be a substrate formed from a metal oxide or a metal nitride. The base substrate 110 according to the exemplary embodiment may be a thin glass sheet having a thickness of 1.5 mm or less. The thin glass sheet may be manufactured using a fusion process or a floating process.

Subsequently, as illustrated in FIG. 3, the mixture firing step S3 is a step of firing the mixture 120 applied to the base substrate 110 in the mixture coating step S2. In the mixture firing step S3 according to the exemplary embodiment, the matrix layer 130 is made by firing the metal oxide nanosuspension 121 of the mixture 120. In addition, the mixture firing step S3 vaporizes the number of thermoplastic polymer particles 122 mixed in the mixture 120, thereby forming the number of closed voids 140 to occupy positions previously occupied by the number of thermoplastic polymer particles 122.

In this regard, the mixture firing step S3 may include first firing performed at a temperature equal to or lower than the melting point of the number of thermoplastic polymer particles 122 and second firing performed at a temperature equal to or higher than the boiling point of the number of thermoplastic polymer particles 122. When polyethylene terephthalate (PET) is used for the number of thermoplastic polymer particles 122, the mixture 120 is first fired at a temperature equal to or lower than 250° C., the melting point of PET, and then is second fired at a temperature equal to or higher than 350° C., the boiling point of PET. That is, in the mixture firing step S3, the first firing and the second firing may be performed with respect to the melting point and the boiling point of a variety of types of the thermoplastic polymer particles 122 contained in the mixture 120. In the mixture firing step, the first firing and the second firing may be performed in a single heat treatment process comprised of different temperature sections.

Figure 4:
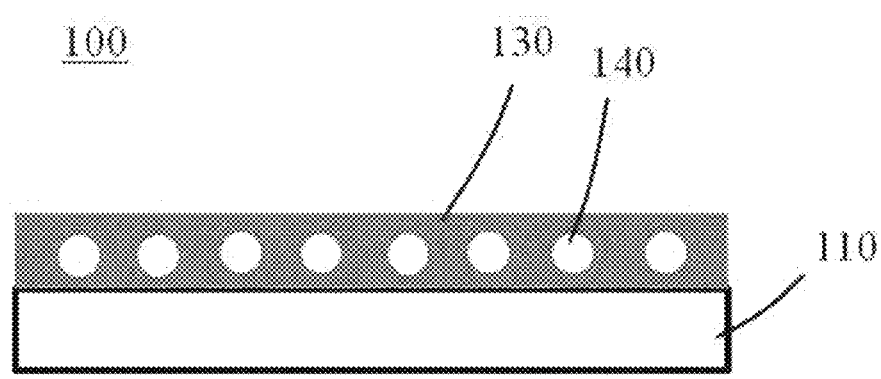

When the mixture firing step S3 is performed using above-described heat treatment processing, the number of thermoplastic polymer particles 122 are vaporized. In addition, as illustrated in FIG. 4, the metal oxide nanosuspension 121 of the mixture 120 is made into the matrix layer 130, within which the number of closed voids 140 are formed in locations that the number of number of thermoplastic polymer particles 122 have occupied before being vaporized. This means that the shapes and sizes of the number of closed voids 140 are adjustable by controlling the shapes and sizes of the number of thermoplastic polymer particles 122. In addition, since the number of closed voids 140 are formed in locations that the number of thermoplastic polymer particles 122 have occupied, the density of the number of closed voids 140 formed within the matrix layer 130 is determined by the amount of the number of thermoplastic polymer particles 122 mixed in the metal oxide nanosuspension 121, from which the matrix layer 130 is formed. This means that the density of the number of closed voids 140 is controllable by adjusting the ratio of the number of thermoplastic polymer particles 122 mixed with the metal oxide nanosuspension 121.

In the mixture firing step S3, the matrix layer 130 may be formed at a thickness of 200 nm to 2000 nm, while the number of closed voids 140 may be formed with diameters of 30 nm to 1 μm.

Figure 6:
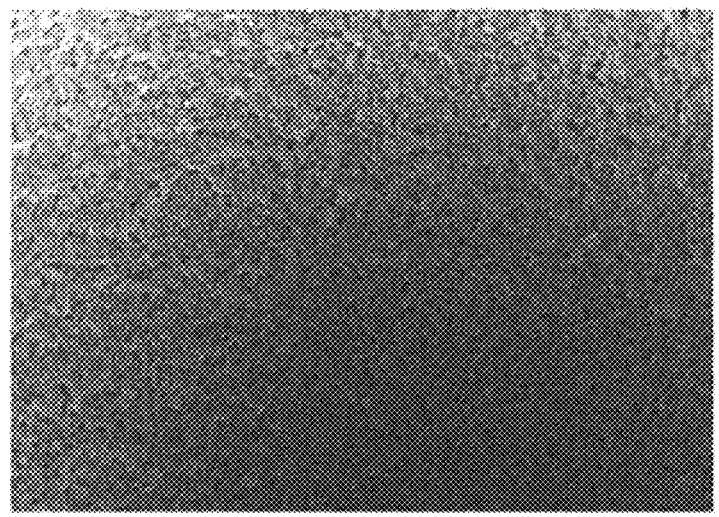
FIGS. 6 and 7 are electron microscope images taken of a surface and edge of a light extraction substrate manufactured according to the exemplary embodiment.
Figure 7:
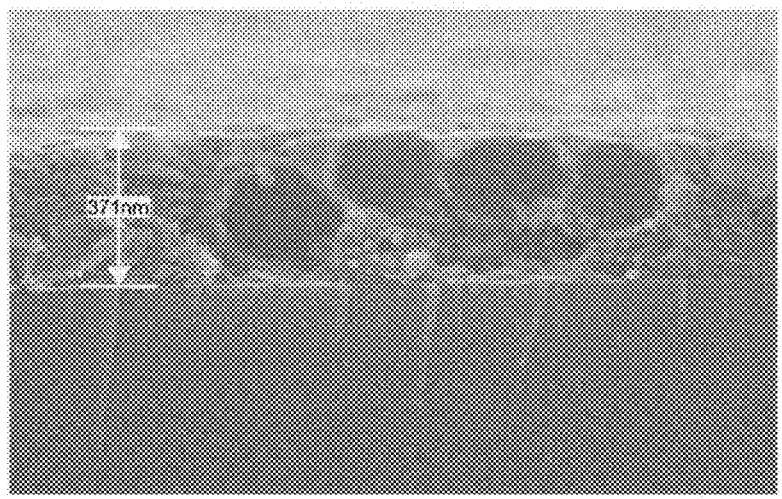

As illustrated in FIG. 4, when the mixture firing step S3 is completed, the light extraction substrate 100 for an OLED according to the exemplary embodiment is manufactured. FIGS. 6 and 7 are electron microscope images taken of a surface and edge of a light extraction substrate manufactured according to the exemplary embodiment. It can be appreciated from the images that a matrix layer and closed voids are properly formed.

Figure 9:
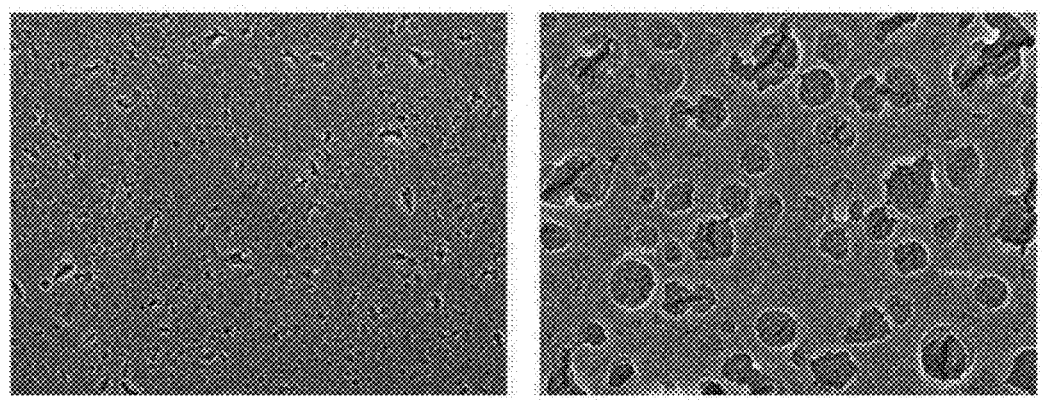
FIG. 9 is electron microscope images illustrating voids when a matrix layer is formed from a non-porous material.

FIG. 9 is electron microscope images illustrating voids when a matrix layer is formed from a non-porous material. When a thermoplastic polymer is vaporized, voids having a disk-shaped structure or an open structure are formed.

The exemplary embodiment is intended to provide the structure of the closed voids 140 that can realize a light-scattering effect equal or equivalent to light-scattering particles, instead of voids having an open structure. In this regard, the sizes of TiO2, a metal oxide for the metal oxide nanosuspension 121, are controlled such that that the matrix layer 130 made in the mixture firing step S3 has a porous structure. When the matrix layer 130 has the porous structure as described above, the porous structure of the matrix layer 130 provides vaporization paths to the number of thermoplastic polymer particles 122, so that the number of closed voids 140 are formed with the closed structure instead of an open structure.

Figure 8:
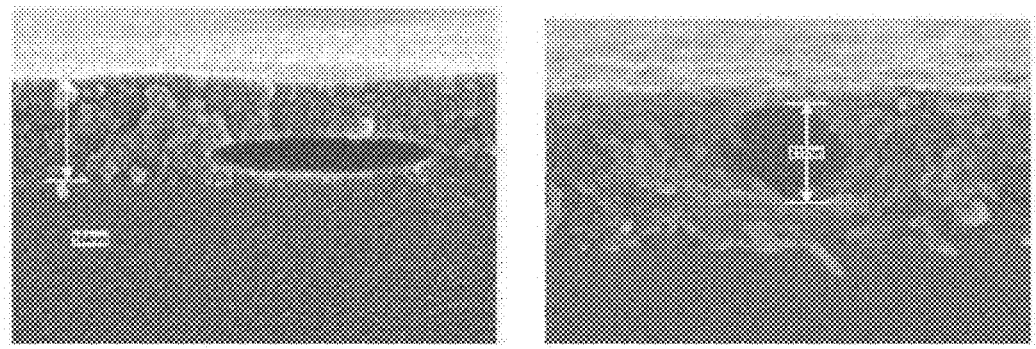
FIG. 8 is electron microscope images illustrating closed voids formed in different shapes depending on TiO2 sizes when TiO2 having a porous structure is used.

FIG. 8 is electron microscope images illustrating that closed voids are formed by the use of TiO2 that forms a porous structure. Referring to the images, the closed voids are formed with different shapes depending on the sizes of TiO2 of nanosuspensions. The right image illustrates a sample made from a nanosuspension composed of TiO2 particles, sizes of which range from 30 nm to 30 nm, while the left image illustrates a sample made from a nanosuspension composed of TiO2 particles, sizes of which range from 5 nm to 10 nm. When the nanosuspension have TiO2 sizes of 30 nm to 30 nm, spherical closed voids are formed, since the shapes of the thermoplastic polymer are retained. When the nanosuspension have TiO2 sizes of 5 nm to 10 nm, closed voids having the shape of a disk, an original shape, are formed. As described above, when the sizes of TiO2 of the nanosuspension are adjusted, the shapes of the closed voids are changed. It is thereby possible to control the shapes of the closed voids.

Figure 5:
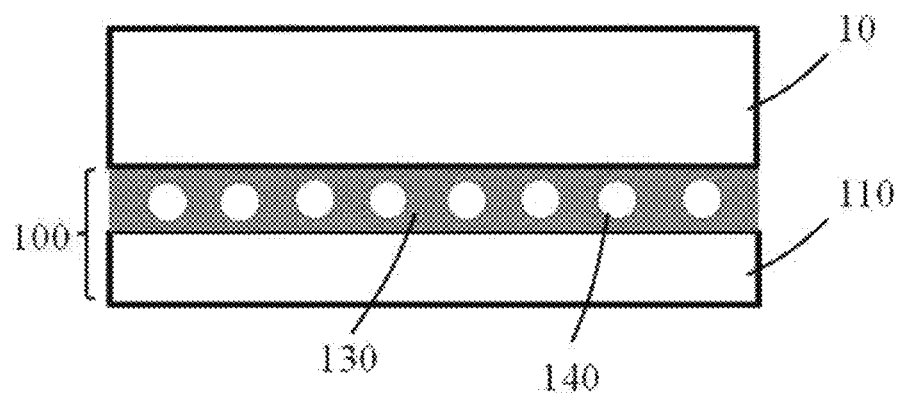
FIG. 5 is a cross-sectional view illustrating an application in which a light extraction substrate manufactured according to the exemplary embodiment is in use with an OLED.

As illustrated in FIG. 5, the light extraction substrate 100 manufactured using the above-described process is disposed on one surface of the OLED 10, through which light generated by the OLED 10 exits, to serve as a functional optical substrate to improve the light extraction efficiency of the OLED 10. In the light extraction substrate 100, the matrix layer 130 and the number of closed voids 140 disposed within the matrix layer 130 form an internal light extraction layer of the OLED 10. The number of closed voids 140 disposed within the matrix layer 130 form a different refractive index structure together with the matrix layer 130 while complexfying or diversifying paths of light emitted by the OLED 10, thereby improving extraction efficiency of light in the forward direction. As described above, the number of closed voids 140 formed by vaporization of the number of thermoplastic polymer particles 122 can realize a light-scattering effect equal or equivalent to conventional light-scattering particles, thereby occupying positions occupied by the expensive conventional light-scattering particles that have been used in internal light extraction layers. Thus, the manufacturing of the light extraction substrate 100 for an OLED by the method of manufacturing a light extraction substrate for an OLED according to the exemplary embodiment can significantly reduce process unit prices.

Although not specifically illustrated, the OLED 10 has a multilayer structure comprised of an anode, an organic light-emitting layer, and a cathode, sandwiched between the light extraction substrate 100 according to the exemplary embodiment and another substrate (not shown) facing the light extraction substrate 100 to encapsulate the OLED 10. The anode may be formed from a metal or metal oxide having a greater work function, such as Au, In, Sn, or indium tin oxide (ITO), to facilitate hole injection. The cathode may be a metal thin film formed from Al, Al:Li, or Mg:Ag that has a smaller work function to facilitate electron injection. When the OLED has a top emission structure, the cathode may have a multilayer structure comprised of a semitransparent electrode of a thin metal film formed from, for example, Al, Al:Li, or Mg:Ag, and a transparent electrode of an oxide thin film formed from, for example, ITO, to facilitate the transmission of light generated by the organic light-emitting layer. The organic light-emitting layer may include a hole injection layer, a hole transport layer, an emissive layer, an electron transport layer, and an electron injection layer that are sequentially stacked on the anode. When the OLED is a white OLED used for lighting, the light-emitting layer may have, for example, a multilayer structure comprised of a high-molecular light-emitting layer that emits blue light and a low-molecular light-emitting layer that emits orange-red light. A variety of other structures that emit white light may also be used. The OLED may also have a tandem structure. In this case, a plurality of organic light-emitting layers alternating with interconnecting layers (not shown) may be provided.

According to this structure, when a forward voltage is induced between the anode and the cathode, electrons migrate from the cathode to the emissive layer through the electron injection layer and the electron transport layer, while holes migrate from the anode to the emissive layer through the hole injection layer and the hole transport layer. The electrons and the holes that have migrated into the emissive layer recombine with each other, thereby generating excitons. When these excitons transit from an excited state to a ground state, light is generated. The brightness of the generated light is proportional to the amount of current flowing between the anode and the cathode.

Hereinafter, a method of manufacturing a light extraction substrate for an OLED according to another exemplary embodiment will be described with reference to FIGS. 10 to 16.

Figure 10:
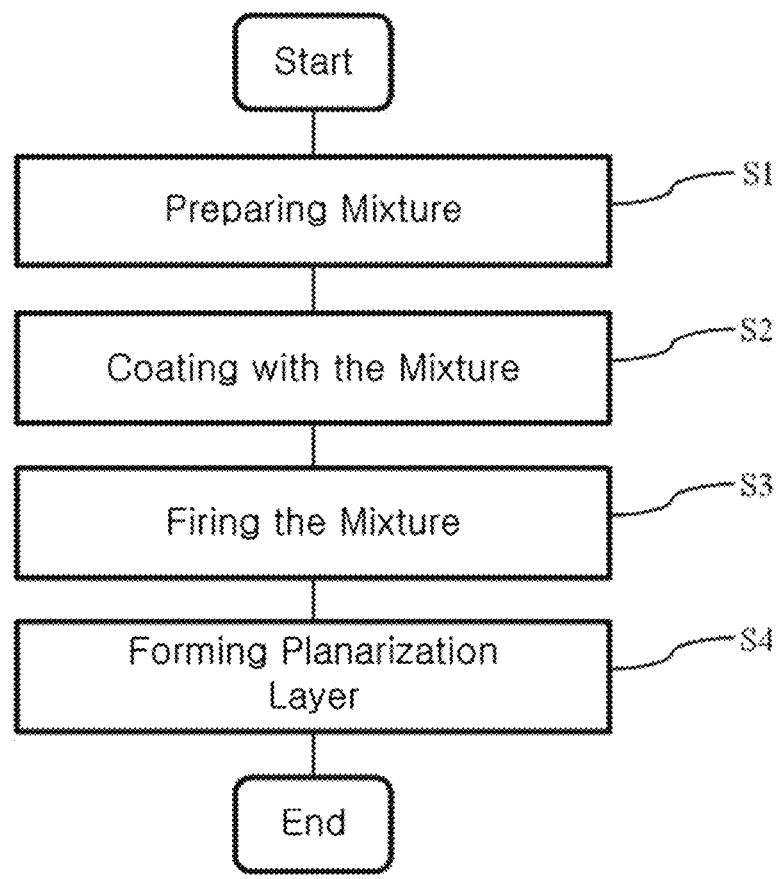
FIG. 10 is a process flowchart illustrating a method of manufacturing a light extraction substrate for an OLED according to another exemplary embodiment.

FIG. 10 is a process flowchart illustrating a method of manufacturing a light extraction substrate for an OLED according to another exemplary embodiment, FIGS. 11 to 14 sequentially illustrate process steps of the method of manufacturing a light extraction substrate for an OLED according to another exemplary embodiment, and FIGS. 15 and 16 are electron microscope images taken of a surface and edge of a light extraction substrate manufactured according to another exemplary embodiment, illustrating the images before and after the formation of a planarization layer.

As illustrated in FIG. 10, the method of manufacturing a light extraction substrate for an OLED according to another exemplary embodiment includes a mixture preparation step S1, a mixture coating step S2, a mixture firing step S3, and a planarization layer forming step S4.

Another exemplary embodiment is substantially the same as the former exemplary embodiment, except for the mixture coating step and the planarization layer forming step. The same components will be designated by the same reference numerals and detailed descriptions thereof will be omitted thereinafter.

Figure 11:
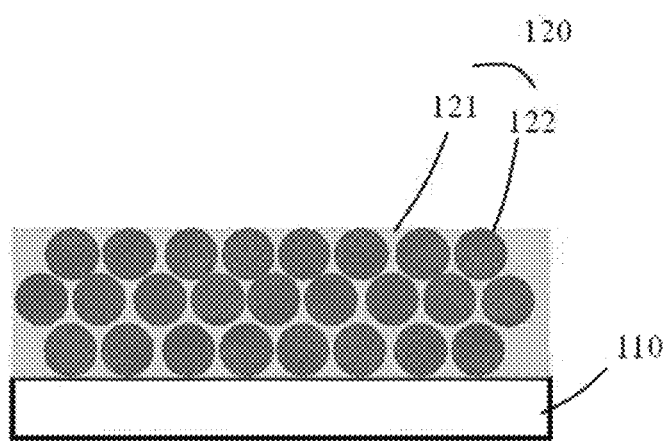
FIGS. 11 to 14 sequentially illustrate process steps of the method of manufacturing a light extraction substrate for an OLED according to another exemplary embodiment.

As illustrated in FIG. 11, in the mixture coating step S2 according to another exemplary embodiment, the top surface of the base substrate 110 is coated with the mixture 120 in a layer-by-layer (LbL) manner by bar coating. Although the mixture 120 is illustrated as being applied in three layers in FIG. 11, this does not specifically limit the number of layers having the LbL structure. In the mixture coating step S2, the base substrate 110 may be coated with the mixture 120 in the LbL manner by making a single coating layer from the mixture 120 by bar coating, removing a solvent by drying at about 100° C., and then making another single coating layer from the mixture 120. When the mixture 120 is coated in the LbL manner as described above, the number of thermoplastic polymer particles 122 within the mixture 120 are arranged in layers.

Figure 12:
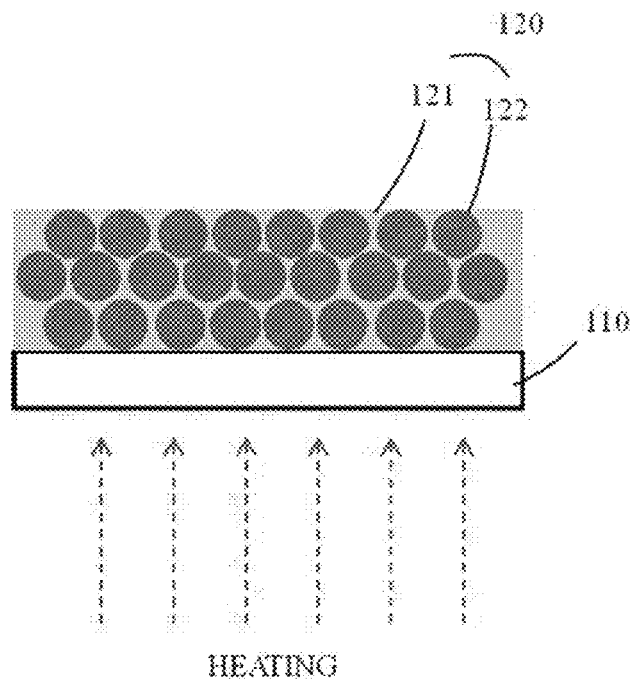
Figure 13:
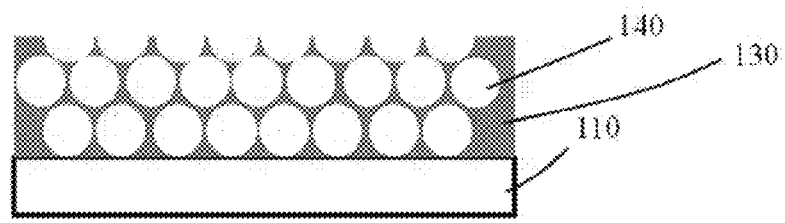

As illustrated in FIGS. 12 and 13, when the mixture 120 coating the top surface of the substrate 110 in the LbL manner due to the mixture coating step S2 is fired, the metal oxide nanosuspension 121 is made into the matrix layer 130. In addition, the number of thermoplastic polymer particles 122 arranged in layers within the mixture 120 are vaporized, so that the number of closed voids 140 are formed to occupy positions previously occupied by the number of thermoplastic polymer particles 122. As illustrated in electron microscope images in FIG. 15, as the mixture 120 in the form of layers is contracted during the firing, a portion of the mixture 120 in the uppermost layer for formation of the surface of the matrix layer 130 is contracted to a thickness lower than the thickness of the number of thermoplastic polymer particles 122 arranged in the mixture 120. At the same time, the number of thermoplastic polymer particles 122 are vaporized during the firing, so that textures are formed on the surface of the matrix layer 130 after the firing is completed.

A light extraction substrate (200 in FIG. 14) according to another exemplary embodiment is a substrate used as an internal light extraction layer of the OLED (10 in FIG. 5), in which the surface of the matrix layer 130 abutting the OLED 10 must be a high flat surface.

Figure 14:
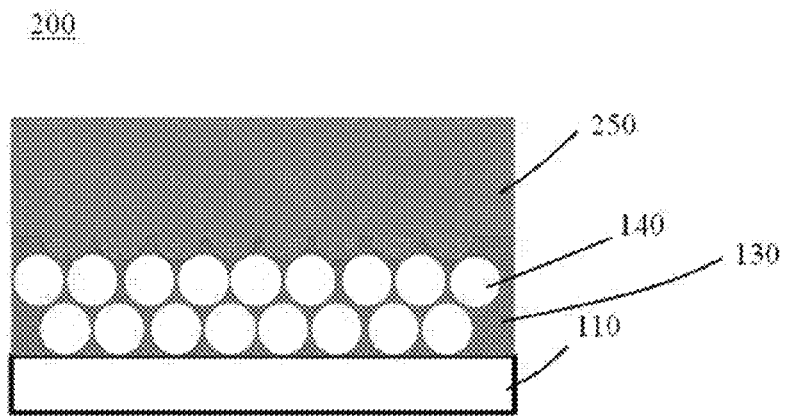

Thus, as illustrated in FIG. 14, the method of manufacturing a light extraction substrate for an OLED according to another exemplary embodiment includes the planarization layer forming step S4 of forming a planarization layer 250 on the matrix layer 130 to improve the decreased surface flatness of the matrix layer 130 after the firing is completed.

In the planarization layer forming step S4, an inorganic material or an organic-inorganic hybrid material may be used for the planarization layer 250. For example, the inorganic material to be used may be a metal oxide, such as SiO2 or ZrO2. In addition, the organic-inorganic hybrid material to be used may be a siloxane polymer containing a metal oxide.

In the planarization layer forming step S4, the matrix layer 130 may be coated with a material, from which the planarization layer 250 is formed, by spin coating. In the spin coating, the thickness of the planarization layer 250 to be formed is adjustable by controlling the number of revolutions. The planarization layer 250 may be formed at a thickness of at least 500 nm, such that the textures can be planarized and a high level of surface flatness can be obtained. FIG. 16 is electron microscope images taken after the planarization layer is formed. It can be appreciated that the surface flatness of the images in FIG. 16 is significantly improved when compared to the images in FIG. 15.

When the planarization layer forming step S4 is completed, the light extraction substrate 200 for an OLED according to another exemplary embodiment is manufactured. In the light extraction substrate 200 for an OLED according to another exemplary embodiment, the number of closed voids 140 are arranged in layers within the matrix layer 130. When the number of closed voids 140 are arranged in layers within the matrix layer 130, paths of light emitted by the OLED (10 in FIG. 5) can be further complexified or diversified, thereby further improving the light extraction efficiency of the OLED (10 in FIG. 5).

Hereinafter, a method of manufacturing a light extraction substrate for an OLED according to a further another exemplary embodiment will be described with reference to FIGS. 17 to 22.

Figure 22:
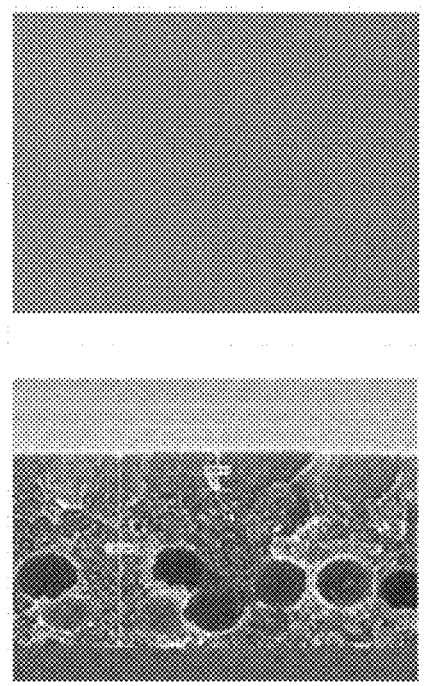

FIG. 17 a process flowchart illustrating a method of manufacturing a light extraction substrate for an OLED according to a further another exemplary embodiment, FIGS. 18 and 19 sequentially illustrate process steps of the method of manufacturing a light extraction substrate for an OLED according to a further another exemplary embodiment, and FIGS. 20 to 22 are electron microscope images taken of a surface and edge of a light extraction substrate manufactured according to a further another exemplary embodiment, in which FIG. 20 illustrates the images before the formation of a capping layer, FIG. 21 illustrates the images before the formation of a planarization layer, and FIG. 22 illustrates the images after the formation of the planarization layer.

As illustrated in FIG. 17, the method of manufacturing a light extraction substrate for an OLED according to a further another exemplary embodiment includes a mixture preparation step S1, a mixture coating step S2, a mixture firing step S3, a capping layer forming step S4, and a planarization layer forming step S5.

Further another exemplary embodiment is substantially the same as another exemplary embodiment, except that the capping layer forming step is added. The same components will be designated by the same reference numerals and detailed descriptions thereof will be omitted thereinafter.

As illustrated in FIG. 18, in the capping layer forming step S4 according to a further another exemplary embodiment, before formation of the planarization layer 250, a capping layer 360 is formed on the matrix layer 130 formed by the completion of the mixture firing step S3. The capping layer 360 can reduce the surface roughness of the matrix layer 130 having textures on the surface thereof. In the mixture firing step S3, the capping layer 360 is formed on the matrix layer 130 using the same material as the metal oxide of the matrix layer 130.

When the capping layer 360 on the matrix layer 130 is formed from the same material as the matrix layer 130, the matrix layer 130 and the capping layer 360 have the same optical characteristics, so that the variable that optical paths are not predictable due to additional scattering at the boundary between the matrix layer 130 and the capping layer can be removed. In addition, when the capping layer 360 formed from the same material as the matrix layer 130 is disposed on the matrix layer 130, the capping layer 360 can planarize the surface textures of the matrix layer 130 to a certain extent. Consequently, as illustrated in FIG. 19, the planarization layer 250 can be formed at a reduced thickness. Comparing the images before the formation of the planarization layer of FIG. 20 to the images after the formation of the planarization layer of FIG. 21, the effect of the planarization layer of improving the surface roughness can be visually detected.

After the capping layer forming step S4, when the planarization layer forming step S5 of forming the planarization layer 250 on the capping layer 360 is completed, a light extraction substrate 300 for an OLED according to a further another exemplary embodiment is manufactured. The light extraction substrate 300 for an OLED according to a further another exemplary embodiment is configured such that the thickness of the planarization layer 250 is reduced to be lower than that of another exemplary embodiment, due to the capping layer 360. When the thickness of the planarization layer 250 is reduced as described above, the distance between the OLED (10 in FIG. 5) and the matrix layer 130 can be minimized, thereby further improving the light extraction efficiency of the OLED (10 in FIG. 5). When the images in FIG. 22 illustrating the planarization layer formed on the capping layer are compared with the images in FIG. 16 illustrating the planarization layer directly formed without the capping layer, the capping layer 360 formed between the matrix layer 130 and the planarization layer 250 can further improve the surface flatness of the planarization layer 250 even in the case in which the thickness of the planarization layer 250 is reduced, thereby further improving the reliability of the OLED (10 in FIG. 5).

Figure 23:
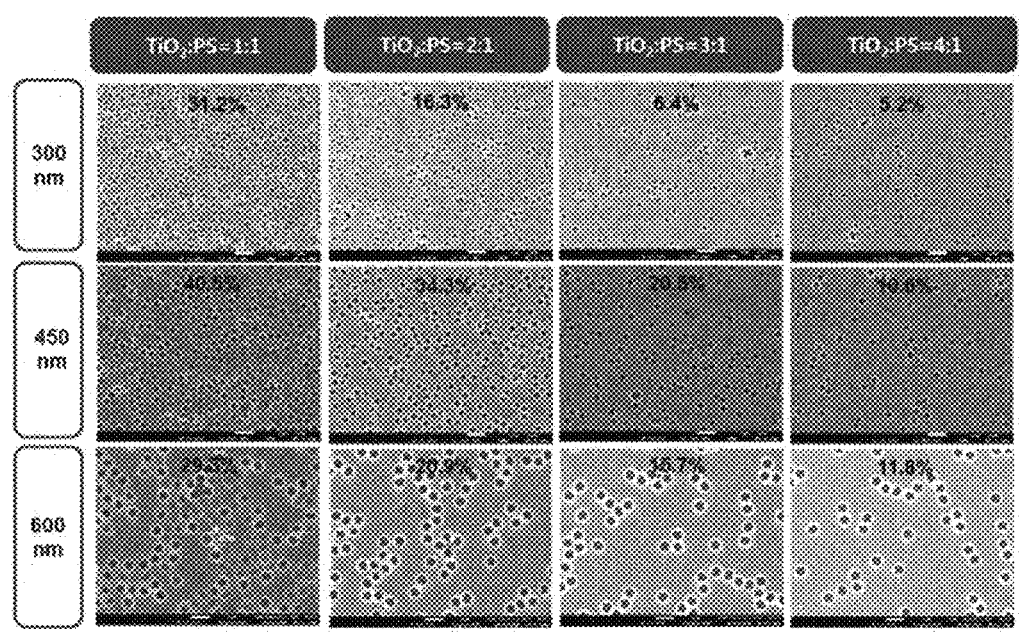
FIG. 23 is electron microscope images illustrating the densities of closed voids formed according to the sizes of polystyrene particles, used as a thermoplastic polymer, and the volume ratios between TiO2 metal oxide and the polystyrene particles.

To determine whether or not the densities of closed voids formed within a matrix layer are controllable, polystyrene (PS) beads and TiO2 were mixed, and a film was coated with a resultant mixture, followed by firing, and the densities of resulting closed voids were measured. The measurements are presented in FIG. 23. Here, suspensions containing 30 wt % PS beads dispersed therein, the sizes of the PS beads being 300 nm, 450 nm, and 600 nm, were mixed with TiO2 at volume ratios of 1:1, 1:2, 1:3, and 1:4. Films were coated with the resultant mixtures, followed by firing. As illustrated in electron microscope images in FIG. 23, it can be appreciated that the higher the concentration of the PS beads is, the higher the density of the closed voids is. At the same sizes of the PS beads, it can be appreciated that the density of the closed voids is the greatest when the volume ratio is 1:1.

Figure 24:
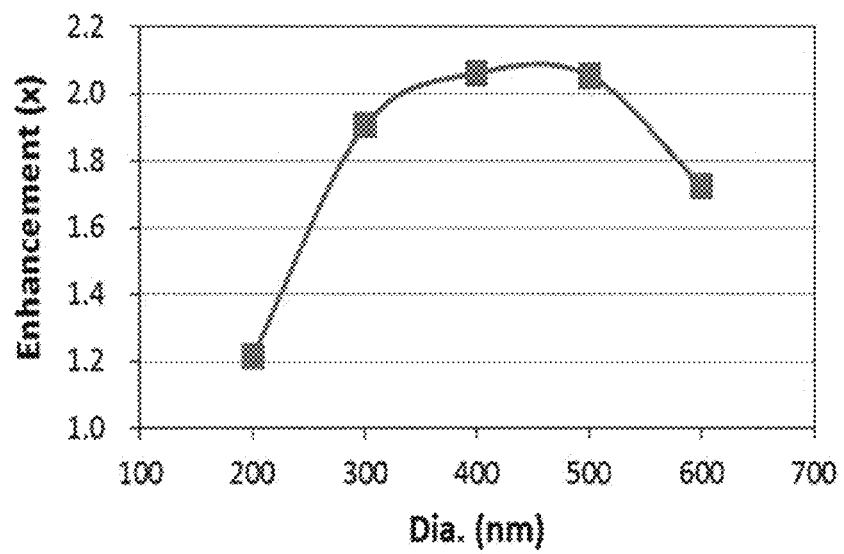
FIG. 24 is a graph illustrating light extraction efficiencies according to the sizes (diameters) of the closed voids.

FIG. 24 is a graph illustrating results obtained by modeling the sizes of closed voids that can maximize the light extraction efficiency of an OLED. A matrix layer was set to have a refractive index of 2.6 and a coating thickness of 800 nm, and a planarization layer was set to have a refractive index of 1.78 and a thickness of 400 nm. Consequently, the light extraction efficiency was determined to be greatest when the diameters of the closed voids were about 400 nm.

Figure 25:
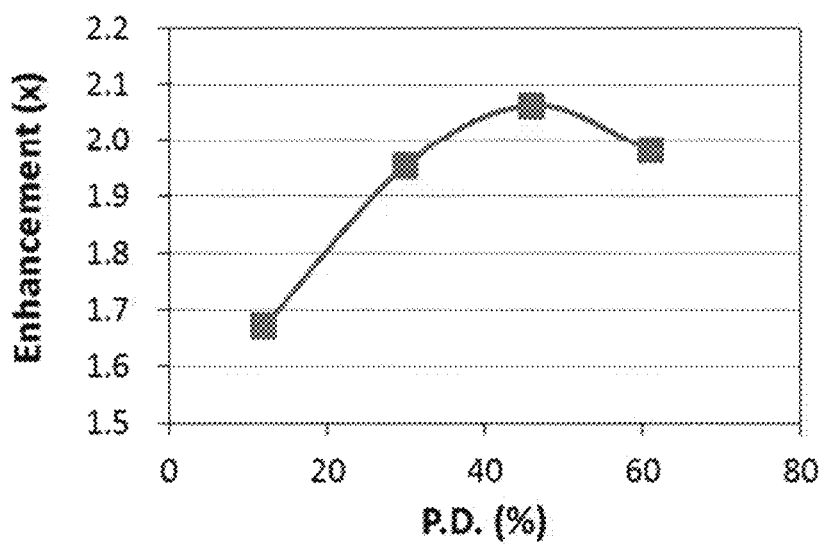
FIG. 25 is a graph illustrating light extraction efficiencies according to the densities of the closed voids.

In addition, FIG. 25 is a graph illustrating results obtained by modeling the densities of closed voids that can maximize the light extraction efficiency of an OLED. A matrix layer was set to have a refractive index of 2.6 and a coating thickness of 800 nm, a planarization layer was set to have a refractive index of 1.78 and a thickness of 400 nm, and diameters of the voids were set to be 400 nm, based on the modeling results in FIG. 24. Consequently, the light extraction efficiency was determined to be greatest when the density of the closed voids was about 46%.

Based on the experimental values and the modeling results as described above, in the preparation of a mixture by mixing a number of thermoplastic polymer particles with a metal oxide nanosuspension, when the thermoplastic polymer particles having diameters of about 400 nm are mixed with the metal oxide nanosuspension at a volume ratio of 1:1, the diameters of closed voids to be formed can be controlled to be about 400 nm and the density of the closed voids formed within a matrix layer can be controlled to be about 46%. This can consequently maximize the light extraction efficiency.

The foregoing descriptions of specific exemplary embodiments of the present disclosure have been presented with respect to the drawings and are not intended to be exhaustive or to limit the present disclosure to the precise forms disclosed, and obviously many modifications and variations are possible for a person having ordinary skill in the art in light of the above teachings.

It is intended therefore that the scope of the present disclosure not be limited to the foregoing embodiments, but be defined by the Claims appended hereto and their equivalents.

The invention claimed is:

1. A method of manufacturing a light extraction substrate for an organic light-emitting diode, the method comprising:
   preparing a mixture by mixing a number of thermoplastic polymer particles with a nanosuspension of a metal oxide;
   coating a base substrate with the mixture; and
   firing the mixture coating the base substrate,
   wherein the number of thermoplastic polymer particles are vaporized during the firing of the mixture, and
   wherein, when the firing of the mixture is completed, a matrix layer is made from the nanosuspension of the metal oxide, and a number of closed voids are formed within the matrix layer, in positions previously occupied by the number of thermoplastic polymer particles before being vaporized.

2. The method of claim 1, wherein a refractive index of the metal oxide used in preparing the mixture ranges from 1.5 to 2.7.

3. The method of claim 2, wherein the metal oxide used in preparing the mixture comprises one metal oxide or a combination of two or more metal oxides selected from a candidate group consisting of $SiO_2$, $TiO_2$, $ZrO_x$, $ZnO$, and $SnO_2$.

4. The method of claim 3, wherein the metal oxide used in preparing the mixture comprises rutile or anatase $TiO_2$.

5. The method of claim 1, wherein the number of thermoplastic polymer particles used in preparing the mixture comprise one selected from a candidate group consisting of polyethylene terephthalate, polystyrene, polypropylene, poly(acrylic acid), poly(methyl methacrylate), polyethylene naphthalate, and polycarbonates.

6. The method of claim 1, wherein the base substrate is coated with the mixture by bar coating.

7. The method of claim 6, wherein the base substrate is coated with the mixture in a layer-by-layer manner by bar coating.

8. The method of claim 7, wherein, in the layer-by-layer manner, the mixture is applied and then dried for respective layers.

9. The method of claim 8, further comprising, after firing the mixture, forming a planarization layer on the matrix layer.

10. The method of claim 9, wherein the planarization layer is formed from an inorganic material or an organic-inorganic hybrid material.

11. The method of claim 9, further comprising, before forming the planarization layer, forming a capping layer on the matrix layer.

12. The method of claim 11, wherein the capping layer is formed from a material the same as the metal oxide, from which the matrix layer is formed.

13. The method of claim 1, wherein firing the mixture comprises first firing at a temperature equal to or lower than a melting point of the number of thermoplastic polymer particles and second firing at a temperature equal to or higher than a boiling point of the number of thermoplastic polymer particles.

14. The method of claim 13, wherein the first firing and the second firing are performed in a single heat treatment process.

15. The method of claim 1, wherein firing the mixture forms the matrix layer having a porous structure able to provide vaporization paths to the number of thermoplastic polymer particles, such that the number of closed voids have a closed structure when the number of thermoplastic polymer particles are vaporized.

16. The method of claim 1, wherein the base substrate comprises a flexible substrate.

17. The method of claim 16, wherein the base substrate comprises a thin glass sheet having a thickness of 1.5 mm or less.

* * * * *